US009756756B2

(12) United States Patent
Martin-Otto et al.

(10) Patent No.: US 9,756,756 B2
(45) Date of Patent: Sep. 5, 2017

(54) DRIVE CAGE AND WIRES

(75) Inventors: William Fred Martin-Otto, Apex, NC (US); Timothy Samuel Farrow, Cary, NC (US); Albert Vincent Makley, Morrisville, NC (US); Marc Richard Pamley, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 1338 days.

(21) Appl. No.: 13/430,363

(22) Filed: Mar. 26, 2012

(65) Prior Publication Data
US 2013/0250508 A1    Sep. 26, 2013

(51) Int. Cl.
H05K 7/14 (2006.01)
G06F 1/18 (2006.01)

(52) U.S. Cl.
CPC .......... *H05K 7/1491* (2013.01); *G06F 1/187* (2013.01); *G06F 1/189* (2013.01); *Y10T 29/49826* (2015.01)

(58) Field of Classification Search
CPC ....... H05K 7/1491; G06F 1/189; G06F 1/187; Y10T 29/49826
USPC .................................................. 361/679.31
See application file for complete search history.

(56) References Cited

U.S. PATENT DOCUMENTS

| | | | | |
|---|---|---|---|---|
| 3,508,730 A * | 4/1970 | Knezo Jr. | ................. | 248/73 |
| 3,903,404 A * | 9/1975 | Beall et al. | ................. | 361/679.4 |
| 4,838,798 A * | 6/1989 | Evans et al. | ................. | 439/61 |
| 4,944,694 A * | 7/1990 | Dorn | ................. | 439/501 |
| 5,018,052 A * | 5/1991 | Ammon et al. | ................. | 361/827 |
| 5,051,868 A * | 9/1991 | Leverault et al. | ................. | 361/679.6 |
| 5,093,887 A * | 3/1992 | Witte | ................. | 385/135 |
| 5,101,106 A * | 3/1992 | Cox et al. | ................. | 250/316.1 |
| 5,136,468 A * | 8/1992 | Wong et al. | ................. | 361/679.6 |
| 5,311,397 A * | 5/1994 | Harshberger et al. | ... | 361/679.58 |
| 5,392,192 A * | 2/1995 | Dunn et al. | ................. | 361/679.58 |
| 5,486,739 A * | 1/1996 | Roberts | ................. | 315/277 |
| 5,495,389 A * | 2/1996 | Dewitt et al. | ................. | 361/679.57 |
| 5,507,650 A * | 4/1996 | Larabell | ................. | 439/61 |
| 5,513,329 A * | 4/1996 | Pecone | ................. | 710/301 |
| 5,563,748 A * | 10/1996 | Hanson | ................. | 360/99.16 |
| 5,598,318 A * | 1/1997 | Dewitt et al. | ................. | 361/679.57 |
| 5,604,871 A * | 2/1997 | Pecone | ................. | 710/301 |
| 5,650,910 A * | 7/1997 | Winick et al. | ................. | 361/679.6 |
| 5,701,231 A * | 12/1997 | Do et al. | ................. | 361/679.48 |
| 5,721,394 A * | 2/1998 | Mulks | ................. | 174/502 |

(Continued)

OTHER PUBLICATIONS

ATX Specification, Version 2.2, 2004 (26 pages).

*Primary Examiner* — David M Sinclair
*Assistant Examiner* — Theron S Milliser
(74) *Attorney, Agent, or Firm* — Brian J. Pangrle

(57) ABSTRACT

A drive cage can include a base side and a top side that define altitude of the drive cage; a front end and a back end that define longitude of the drive cage; a lateral side disposed between the front end and the back end and between the base side and the top side; drive bays where each drive bay extends longitudinally; a first wire bundle clip fixed to the top side that extends longitudinally to a free end; and a second wire bundle clip fixed to the lateral side that extends altitudinally to a free end. Such an example may further include a wire bundle clipped to the drive cage via the first wire bundle clip and the second wire bundle clip. Various other apparatuses, systems, methods, etc., are also disclosed.

18 Claims, 5 Drawing Sheets

(56) References Cited

U.S. PATENT DOCUMENTS

| | | | |
|---|---|---|---|
| 5,761,029 A * | 6/1998 | Jay | 361/679.33 |
| 5,774,337 A * | 6/1998 | Lee et al. | 361/725 |
| 5,784,251 A * | 7/1998 | Miller et al. | 361/679.6 |
| 5,835,346 A * | 11/1998 | Albani et al. | 361/679.4 |
| 5,890,693 A * | 4/1999 | Do et al. | 248/346.03 |
| 5,933,563 A * | 8/1999 | Schaffer et al. | 385/135 |
| 6,005,195 A * | 12/1999 | Kam | 174/135 |
| 6,052,276 A * | 4/2000 | Do et al. | 361/679.4 |
| 6,095,461 A * | 8/2000 | Daoud | 248/65 |
| 6,137,675 A * | 10/2000 | Perkins | 361/679.03 |
| 6,219,235 B1 * | 4/2001 | Diaz et al. | 361/695 |
| 6,359,775 B1 * | 3/2002 | Revis | 361/679.27 |
| 6,360,422 B1 * | 3/2002 | Kam | 29/525.11 |
| 6,365,829 B1 * | 4/2002 | Kam | 174/46 |
| 6,456,486 B1 * | 9/2002 | Frame et al. | 361/679.37 |
| 6,507,487 B1 * | 1/2003 | Barina et al. | 361/679.33 |
| 6,583,989 B1 * | 6/2003 | Guyer et al. | 361/724 |
| 6,618,244 B2 * | 9/2003 | Wooden et al. | 361/679.58 |
| 6,646,893 B1 * | 11/2003 | Hardt et al. | 361/826 |
| 6,707,978 B2 * | 3/2004 | Wakileh et al. | 385/134 |
| 6,862,172 B2 * | 3/2005 | Erickson et al. | 361/679.31 |
| 7,035,085 B2 * | 4/2006 | Lee | 361/624 |
| 7,097,047 B2 * | 8/2006 | Lee et al. | 211/26.2 |
| 7,171,098 B2 * | 1/2007 | Weinegger | 385/134 |
| 7,298,615 B2 * | 11/2007 | Wong | 361/679.48 |
| 7,614,149 B2 * | 11/2009 | Boe | 29/876 |
| 7,700,876 B2 * | 4/2010 | Nishikino et al. | 174/68.1 |
| 7,707,718 B2 * | 5/2010 | Boe | 29/876 |
| 7,964,793 B2 * | 6/2011 | Anderson et al. | 174/50 |
| 8,009,956 B2 * | 8/2011 | Weinegger et al. | 385/135 |
| 8,045,324 B2 * | 10/2011 | Shen et al. | 361/679.02 |
| 8,601,291 B2 * | 12/2013 | Ewing et al. | 713/300 |
| 8,611,057 B2 * | 12/2013 | Parker et al. | 361/54 |
| 8,687,350 B2 * | 4/2014 | Santos | 361/679.02 |
| 2001/0040705 A1 * | 11/2001 | Yokota | 358/474 |
| 2003/0075646 A1 * | 4/2003 | Womack et al. | 248/49 |
| 2004/0007371 A1 * | 1/2004 | Chang | 174/50 |
| 2005/0057912 A1 * | 3/2005 | Hardt et al. | 361/826 |
| 2005/0076479 A1 * | 4/2005 | Rolla et al. | 24/302 |
| 2005/0277327 A1 * | 12/2005 | Aziz et al. | 439/528 |
| 2006/0024078 A1 * | 2/2006 | Matsusaka | 399/88 |
| 2006/0067066 A1 * | 3/2006 | Meier et al. | 361/785 |
| 2006/0268506 A1 * | 11/2006 | Boe | 361/685 |
| 2007/0002530 A1 * | 1/2007 | Boe | 361/683 |
| 2008/0024999 A1 * | 1/2008 | Huang | 361/724 |
| 2009/0174991 A1 * | 7/2009 | Mahdavi | 361/679.02 |
| 2011/0180314 A1 * | 7/2011 | Pedoeem et al. | 174/377 |
| 2011/0228472 A1 * | 9/2011 | Makley et al. | 361/679.58 |
| 2011/0242758 A1 * | 10/2011 | Makley et al. | 361/679.58 |

* cited by examiner

DRIVE CAGE AND WIRES

TECHNICAL FIELD

Subject matter disclosed herein generally relates to drive cages and wires.

BACKGROUND

Computers include a variety of wires. Some wires may emanate from a power supply and be routed to various components of a computer. Space or spaces occupied by such wires may create constraints that impact layout of components in a computer.

SUMMARY

A drive cage can include a base side and a top side that define altitude of the drive cage; a front end and a back end that define longitude of the drive cage; a lateral side disposed between the front end and the back end and between the base side and the top side; drive bays where each drive bay extends longitudinally; a first wire bundle clip fixed to the top side that extends longitudinally to a free end; and a second wire bundle clip fixed to the lateral side that extends altitudinally to a free end. Such an example may further include a wire bundle clipped to the drive cage via the first wire bundle clip and the second wire bundle clip. Various other apparatuses, systems, methods, etc., are also disclosed.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
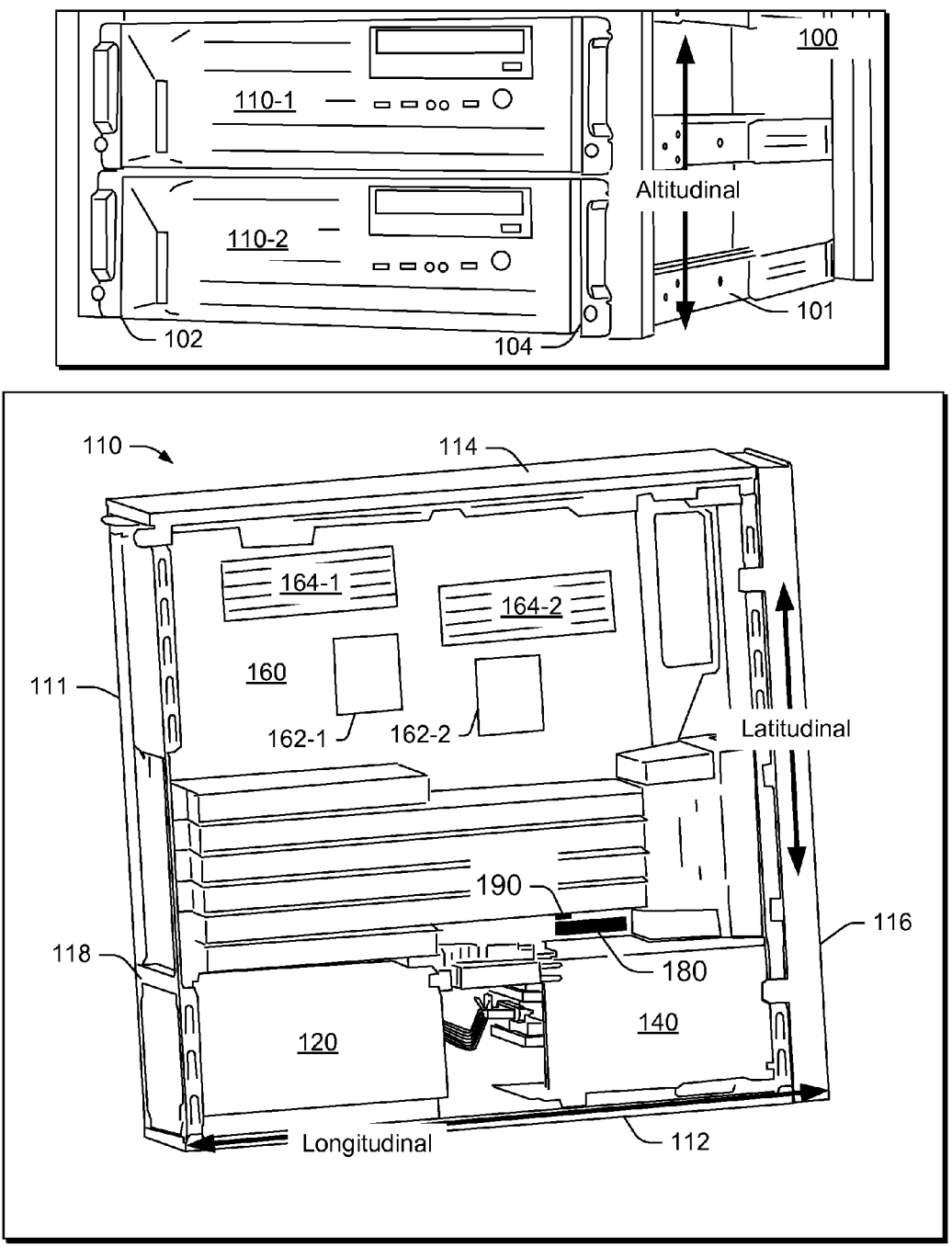
FIG. 1 is a perspective view of an example of system and a perspective view of an example of a computer.

FIG. 1 shows an example of a system 100 that includes a rack 101 and rack-mounted computers 110-1 and 110-2 and an example of some components in one such computer 110. The rack 101 defines a distance between two sides 102 and 104 for receipt of equipment such as the computers 110-1 and 110-2. As an example, the rack 101 may be a "19-inch rack", which is a standardized frame or enclosure format for mounting equipment. Equipment for mounting in a 19-inch rack may include a front panel that is approximately 19 inches (e.g., about 483 mm) across, for example, including edges or ears that may protrude on each side (e.g., to allow for fastening to the rack with screws, etc.). Equipment for mounting in a 19-inch rack may include a chassis that is approximately 17 inches (e.g., about 427 mm) across. As to height of equipment, various standards also exist. For example, height may be specified as a multiple of about 1.75 inches (e.g., about 44.45 mm) and referred to as one rack unit or "U" (e.g., consider a rack that is 42 U tall). When designing or building a computer (or other equipment) to mount in a 19-inch rack, various space filing considerations may be taken into account, for example, to conform to one or more chassis specifications.

In the example of FIG. 1, the computer 110 may be defined with respect to altitudinal, latitudinal and longitudinal axes or directions. In such a coordinate system, altitudinal runs up and down, latitudinal runs side to side, and longitudinal runs end to end. As shown, the computer 110 includes a power supply 120, a drive cage 140, a motherboard 160 and power connectors 180 and 190. In the example of FIG. 1, the motherboard 160 includes fixtures for two processor units 162-1 and 162-2 and fixtures for associated memory 164-1 and 164-2. The fixtures 162-1, 162-2, 164-1 and 164-2 include one or more conductive pathways to receive power supplied to one or more of the power connectors 180 and 190. In the example of FIG. 1, power is to be supplied from the power supply 120 to the power connectors 180 and 190. As shown in FIG. 1, potential routes for placement of wires may be limited within the confines of a chassis 111 of the computer 110 (e.g., based on locations, sizes, etc., of various components).

In the example of FIG. 1, the chassis 111 includes side components 112 and 114 and end components 116 and 118. The side components 112 may define latitude while the end components 116 and 118 may define longitude. Given these two dimensions, top and bottom may define altitude.

As an example of a computer, consider a computer with a chassis to fit within rails of a 19-inch rack where the chassis carries a power supply, a drive cage, and a dual CPU motherboard where the motherboard includes a main ATX power connector in front of a PCI I/O area of the motherboard. The location of the main ATX power connector, in combination with the bulk of wire required to route from the power supply to the main ATX power connector location, can present a routing challenge, especially where the chassis needs to fit into a 19-inch rack (e.g., and be on the order of a 3 U rack size).

A routing challenge, as an example, may be posed by a double-wide video card, for example, slotted in a lower PCI Express ×16 slot (e.g., which may be the third slot from a bottom of a motherboard). Such an arrangement may leave little space to route cables to an ATX power connector (e.g., leave a space that is about one card slot wide). Further, where a video card includes a fan, routing of cables may impede air flow with respect to the fan, which may cause a video card to overheat, shutdown, etc. To address such routing challenges, a computer may include a drive cage (e.g., to receive one or more Serial Attached SCSI drives (SAS drives)) and a bundle of wires (i) routed longitudinally from the power supply to a lateral side of the drive cage, (ii) bent altitudinally, (iii) directed to an edge of a top side of the drive cage, (iv) bent latitudinally and (iv) directed across a top side of the drive cage. Once across the top side of the drive cage, various wires in the bundle may be extended and connected to their proper connectors on the motherboard (e.g., including at least the main ATX power connector) or one or more other components (e.g., carried by the chassis). In such an example, the wires may be routed in a manner that does not impede a longitudinal gap between the power supply and the drive cage. In such an example, where the power supply includes a fan, the fan may provide for air flow through the drive cage (e.g., to cool one or more drives). Where the wires avoid the gap, they do not impede air flow. As to examples of arrangement that include a double-wide video card, consider, as an example, the QUADRO 5000 video card marketed by NVIDIA Corporation, Santa Clara, Calif., which is a dual slot card having dimensions of about 4.38 inches by about 9.75 inches (e.g., where 3 U is about 5.25 inches).

As to a drive cage, such a cage may include features for receipt of one or more hard disk drives (HDDs), one or more solid-state drives (SSDs), or one or more other types of drives and may include features for receipt of drives of different types. As an example, a drive cage may include drive bays. A drive may be a data storage device, for example, to store persistent data and to provide access to the same.

Figure 2:
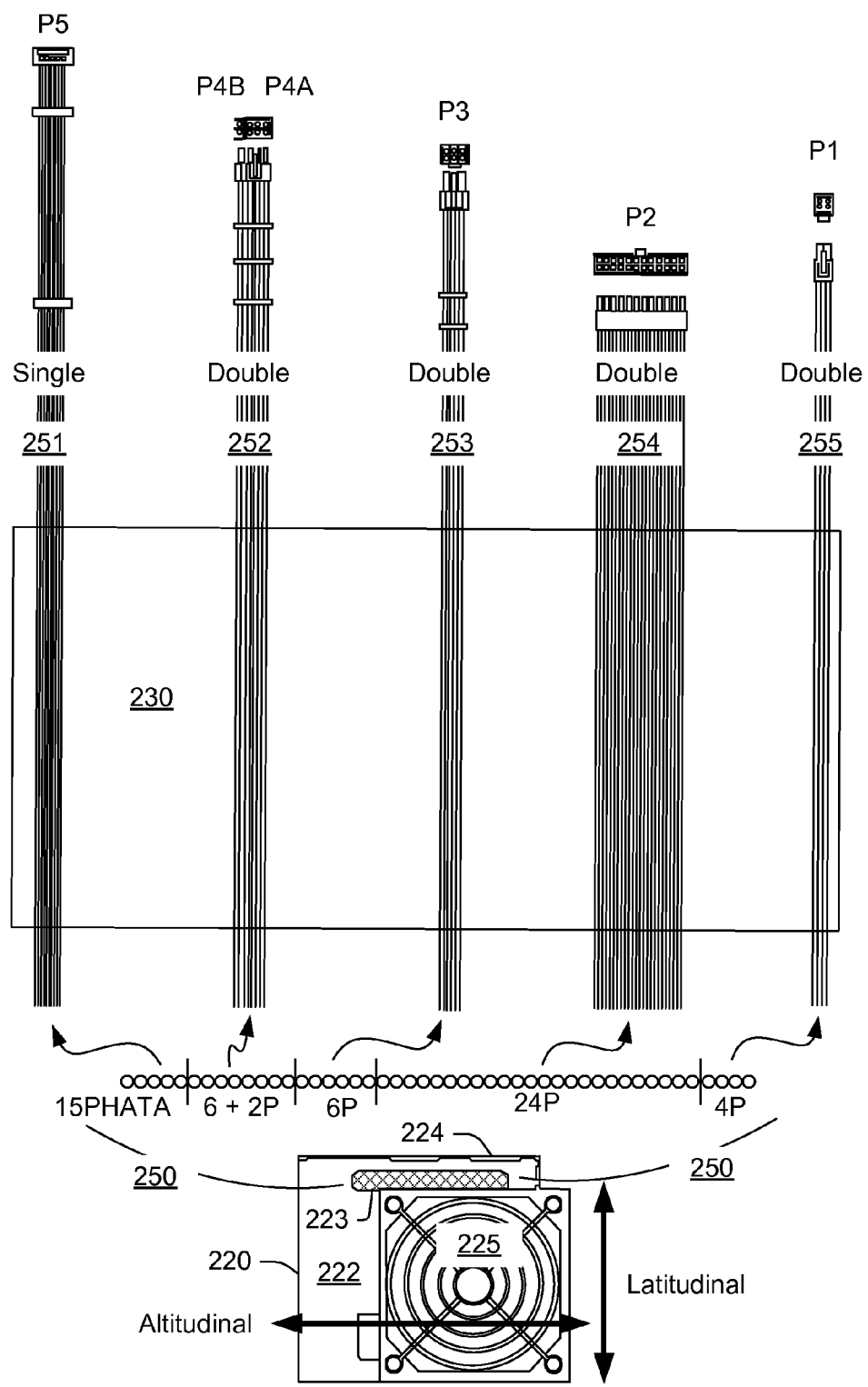
FIG. 2 is a view of an example of a power supply and examples of wires that may extend from the power supply.

FIG. 2 shows an example of a power supply 220 and examples of some types of wires 250 (e.g., with associated connectors) that may extend from the power supply 220. FIG. 2 also shows tape 230 (e.g., one or more pieces of film to bundle at least some of the wires 250). In the example of FIG. 2, the power supply 220 includes a front end 222, an opening 223, a lateral side 224 and a fan 225. The various wires 250 may include a group of five wires 251 (e.g., 15 PHATA), a group of 8 wires 252 (e.g., 6+2 P), a group of 6 wires (e.g., 6 P), a group of 24 wires (e.g., 24 P), and a group of 4 wires (e.g., 4 P). In the example of FIG. 2, the group 251 may be single height (e.g., a 1-n array) while the groups 252, 253, 254 and 255 may each be double height (e.g., each a 2-n array).

As to connectors, the group 251 may include a P5 connector, the group 252 may include a P4B and P4A connector, the group 253 may include a P3 connector, the group 254 may include a P2 connector and the group 255 may include a P1 connector. Referring to the example of FIG. 1, the connector 180 of the motherboard 160 may be a P2 connector while the connector 190 of the motherboard 160 may be a P1 connector.

Figure 3:
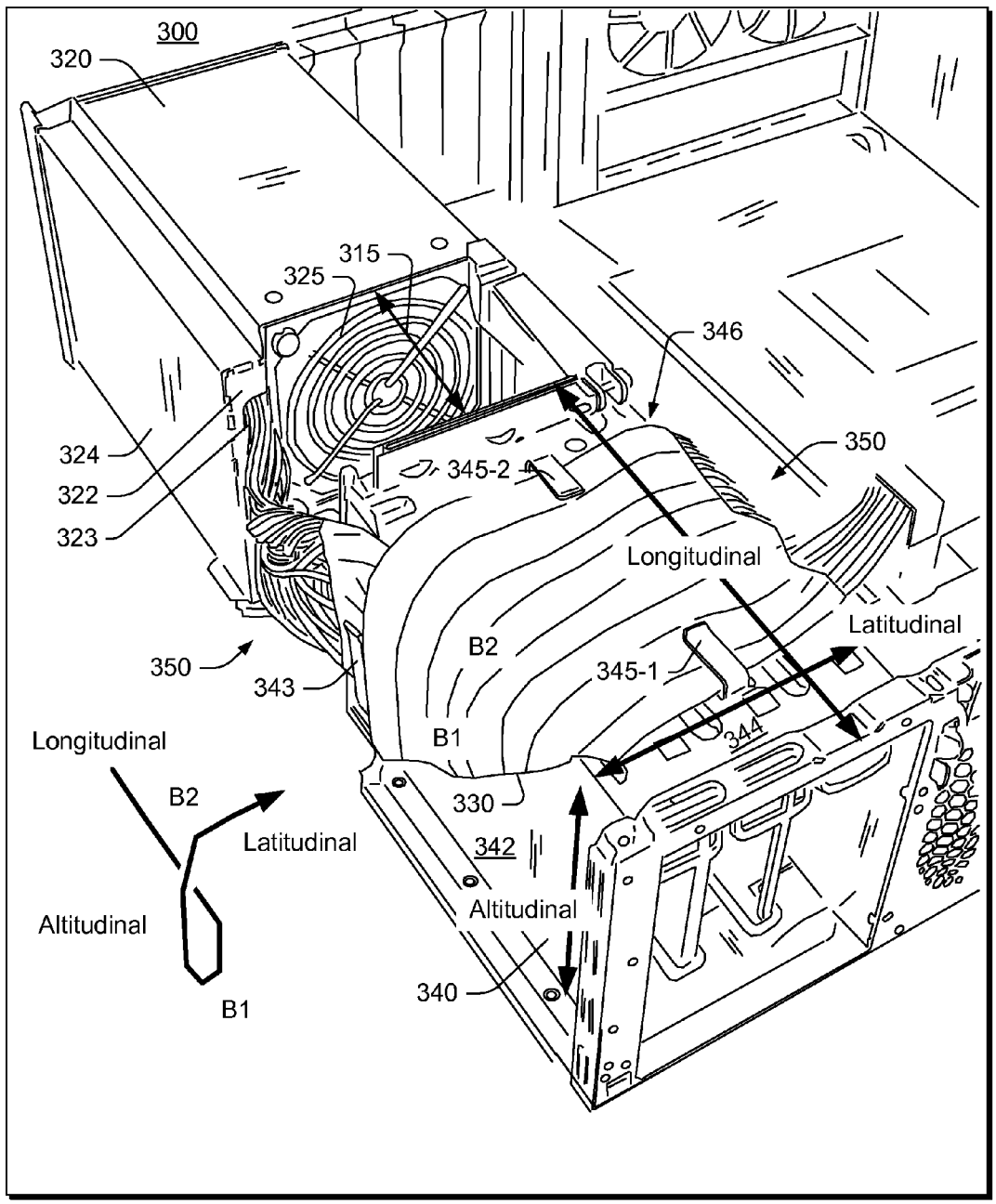
FIG. 3 is a perspective view of an example of a computer that includes a power supply, wires and a drive cage.

FIG. 3 shows a perspective view of an example of a system 300 that includes a power supply 320, a drive cage 340 (e.g., with three drive bays) and wires 350. In the example of FIG. 3, the wires 350 emerge from an opening 323 in an end 322 of the power supply 320 that includes a fan 325. The wires 350 extend longitudinally toward the drive cage 340 avoiding a gap 315 between the power supply 320 and the drive cage 340. By avoiding the gap 315, the wires 350 do not impede (e.g., block) air flow between the fan 325 and the drive cage 340. At the drive cage 340, the wires 350 are held to a lateral side 342 of the drive cage 340 via a clip 343. In the example of FIG. 3, the clip 343 has a fixed end and a free end arranged altitudinally such that the wires 350 seat in the clip 343 (e.g., with assistance of gravity where the free end is oriented upwardly). At the lateral side 342 of the drive cage 340, the wires 350 include a longitudinal to altitudinal bend, for example, where they move outwardly away from the lateral side 342 of the drive cage 340 and then altitudinally toward the top side 344 of the drive cage 340. At such a bend, the wires 350 oriented altitudinally do not rest against the lateral side 342 of the drive cage 340; thus, for at least a portion of their lengths, the wires 350 are spaced a distance from the lateral side 342 of the drive cage 340. Depending on dimensions, etc., wires directed altitudinally may contact a lateral side, for example, as they near a top side. As another example, a bend longitudinal to altitudinal bend may be directed toward a lateral side of a drive cage (e.g., which may space longitudinally directed wires away from the lateral side).

In the example of FIG. 3, as the wires 350 approach the top side 344 of the drive cage 340, they include another bend, which is an altitudinal to latitudinal bend. The wires 350 may be held to the top side 344 of the drive cage 340 via one or more clips 345-1 and 345-2. In the example of FIG. 3, each of the clips 345-1 and 345-2 includes a fixed end and an open end oriented longitudinally. As shown, the clips 345-1 and 345-2 have opposing orientations in that their free ends face each other. In the example of FIG. 3, the wire 350 is taped via tape 330 (e.g., film with adhesive properties). The taped wire 350 may be considered to be a wire bundle. As shown, it is held to the top side 344 of the drive cage 340 by both of the clips 345-1 and 345-2. The wires 350, as taped with the tape 330, extend latitudinally to about another lateral side 346 of the drive cage 340.

In the example of FIG. 3, the wires 350 include a first bend (B1) and a second bend (B2). The orientation of these bends with respect to a coordinate system is shown where directions include longitudinal, latitudinal and altitudinal. As shown, the first bend (B1) can cause wires to fold over each other latiduinally.

Figure 4:
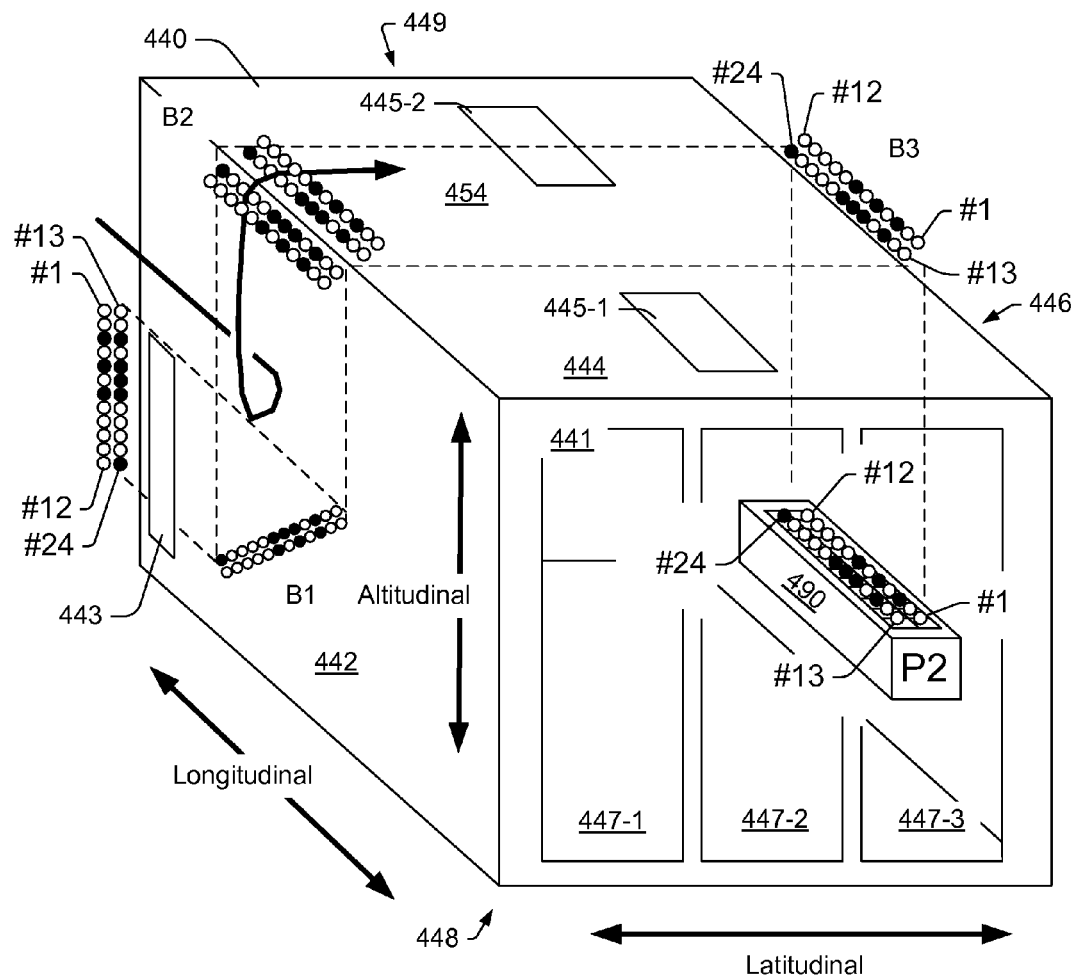
FIG. 4 is a perspective view of an example of a wire routing scheme.

FIG. 4 shows a perspective view of an example of a drive cage 440 with respect to 24 wires 454. In the example of FIG. 4, the wires 454 are coded with black filed wires to illustrate various orientations with respect to a first bend (B1), a second bend (B2) and a third bend (B3). Additionally, four of the wires are numbered: #1, #12, #13 and #24.

In the example of FIG. 4, the drive cage 440 includes opposing lateral sides 442 and 446, opposing ends 441 and 449, a top side 444 and a base side 448 and drive bays 447-1, 447-2 and 447-3. The various sides and ends may define longitude, latitude and altitude with respect to the drive cage 440 and the wires 454.

As shown, the wires 454 extend partially across the lateral side 442 of the drive cage 440 to a first bend (B1), which is a longitudinal to altitudinal bend to direct the wires 454 altitudinally towards the top side 444 of the drive cage 440. The wires 454 include a second bend (B2), which is an altitudinal to latitudinal bend to direct the wires 454 latitudinally across the top side 444 of the drive cage 440 toward the other lateral side 446 of the drive cage 440. The wires 454 include a third bend (B3), which is a latitudinal to altitudinal bend to direct the wires 454 at least partially altitudinally toward a connector 490, which may be a P2 connector (e.g., mounted on a motherboard) configured for receipt of a corresponding connector of the wires 454 (e.g., near the base side 448 of the drive cage 440). As indicated in the example of FIG. 4, the orientation of the wires 454 prior to the first bend (B1) assures that the orientation of the wires 454 after the third bend (B3) is proper for the connector 490 (e.g., a motherboard power connector).

As an example, a drive cage can include a base side and a top side that define altitude of the drive cage; a front end and a back end that define longitude of the drive cage; a lateral side disposed between the front end and the back end and between the base side and the top side; drive bays where each drive bay extends longitudinally; a first wire bundle clip fixed to the top side that extends longitudinally to a free end; and a second wire bundle clip fixed to the lateral side that extends altitudinally to a free end. Such an example may further include a wire bundle clipped to the drive cage via the first wire bundle clip and the second wire bundle clip.

As an example, a wire bundle may be a taped wire bundle. As an example, a wire bundle may include a bundle width defined in part by a wire diameter of a wire in the wire bundle. As an example, a wire bundle may include a bundle height defined in part by a wire diameter of a wire in the wire bundle. As an example, a wire bundle can include at least twenty-four wires (e.g., which may be double stacked in a 2×12 array). As an example, a wire bundle can include wires for a motherboard. As an example, a wire bundle can include wires extending from a power supply. As an example, wires in a wire bundle may include wire in a range of 24 gauge to 14 gauge.

As an example, a wire bundle can include a longitudinal to altitudinal bend. In such an example, a longitudinal portion of the bend may contact a lateral side of a drive cage. In such an example, a space may exist between an altitudinal portion of the bend and the lateral side.

As an example, a system can include one or more processors; memory; a power supply; a drive cage that includes a base side and a top side that define altitude of the drive cage, a front end and a back end that define longitude of the drive cage, a lateral side disposed between the front end and the back end and between the base side and the top side, and drive bays where each drive bay extends longitudinally; at least one drive disposed in one of the drive bays of the drive cage; and a wire bundle that extends from the power supply towards the drive cage and that includes a longitudinal to altitudinal bend along the lateral side of the drive cage for passage of the wire bundle to the top side of the drive cage. In such an example, the drive cage can include another lateral side and where the lateral sides define latitude of the drive cage. As an example, a wire bundle can include an altitudinal to latitudinal bend for passage of the wire bundle over a top side of a drive cage.

As an example, a system can include a motherboard where a wire bundle includes at least some wires for connection to the motherboard. In such an example, the motherboard may be set in a chassis, for example, a chassis that has a width in a range of approximately 420 mm to approximately 450 mm (e.g., a chassis configured to mount in a 19-inch rack). As an example, a chassis may include a height in a range of approximately 125 mm to approximately 135 mm (e.g., a chassis configured to mount in a rack with about a 3 U height).

As an example, a system can include a power supply with a fan where a gap extends longitudinally between the fan and a drive cage. In such an example, a wire bundle may be routed to avoid the gap.

As an example, where a wire bundle includes wires to be directed to two or more connectors, at least some of the wires may be split from the bundle, for example, voltage regulator module (VRM) wires may be separated from or provided separately from other wires. As an example, a method may bring ATX wires and primary VRM wires out of a power supply in-line with a drive cage. Such wires may be ordered and bundled into one or more bundles, for example, using tape. Such wires may be bent to direct the wires from a lateral side of a drive cage to a top side of the drive cage. Such wires may traverse the top side of the drive cage to reach a position near a motherboard that includes an ATX connector and a VRM connector for wires in the bundle or bundles.

Figure 5:
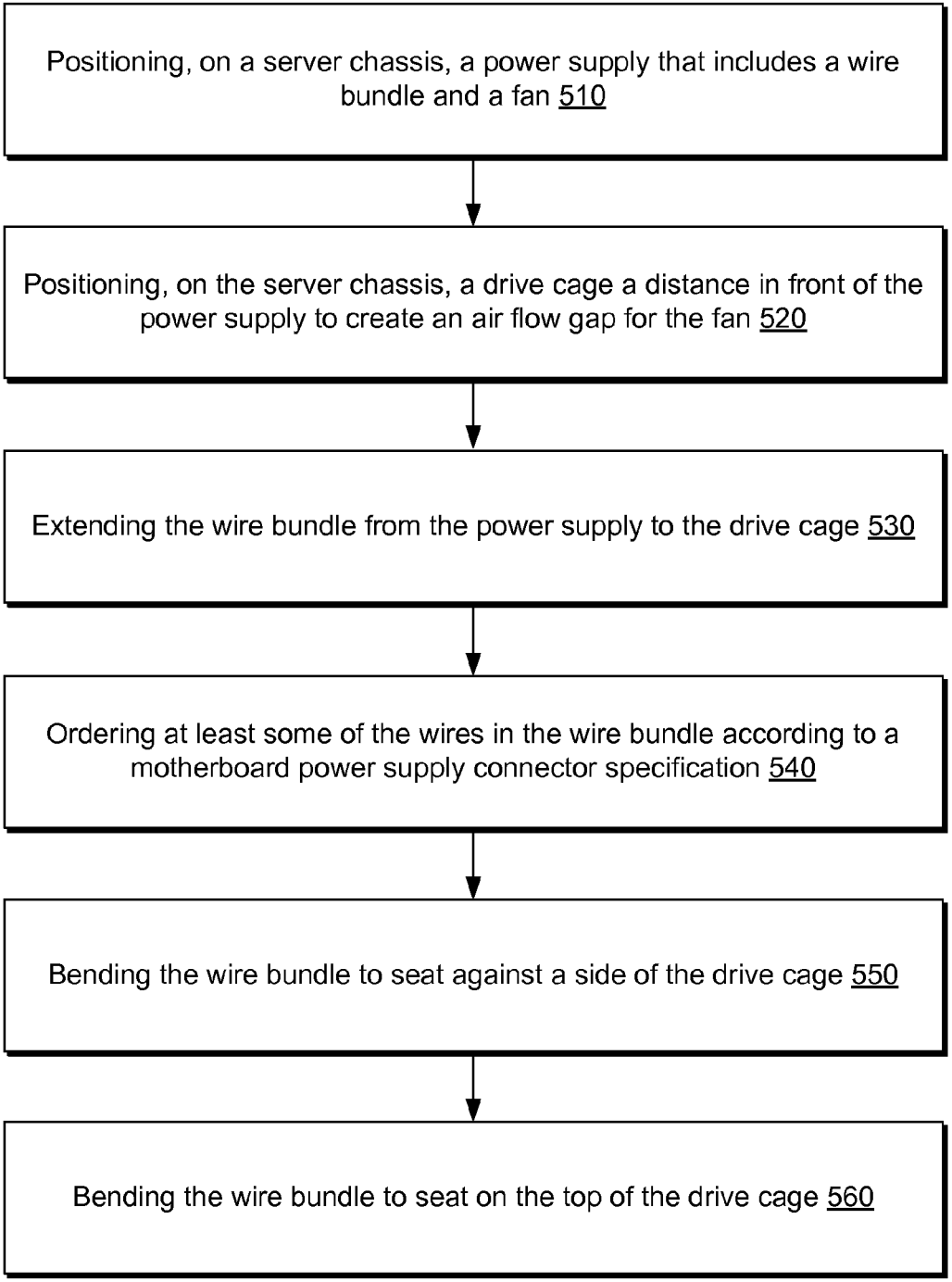
FIG. 5 is a block diagram of an example of a method.

FIG. 5 shows an example of a method 500. In the example of FIG. 5, the method 500 can include positioning, on a server chassis, a power supply that includes a wire bundle and a fan; positioning, on the server chassis, a drive cage a distance in front of the power supply to create an air flow gap for the fan; extending the wire bundle from the power supply to the drive cage; ordering at least some of the wires in the wire bundle according to a motherboard power supply connector specification; bending the wire bundle to seat against a side of the drive cage; and bending the wire bundle to seat on the top of the drive cage. Such a method may also include clipping the wire bundle to the drive cage. As to bending a wire bundle to seat against a side of a drive cage, a bend may be outward or inward (e.g., latitudinally) and then toward a top side (e.g., altitudinally) where the bend results in, for example, longitudinally directed or altitudinally directed wires to seat against the side of the drive cage. Such seating may be assisted using, for example, a clip.

In the example of FIG. 5, the bending may bend the wire bundle from a longitudinal direction to an altitudinal direction and from an altitudinal direction to a latitudinal direction. Such a method may provide for routing of wires in a chassis, for example, a chassis that may be configured to fit in a standard rack (e.g., a 19-inch rack).

As an example, a method can include taping wires. In such an example, taping may tape wires prior to bending or optionally after making a bend or both prior to and after. Tape can include film where the film includes adhesive properties (e.g., via an adhesive, elasticity, etc.). For example, a plastic film wrap may include adhesive properties, for purposes of bundling wires, via elasticity (e.g., "cling").

Although some exemplary methods, devices, systems, arrangements, etc., have been illustrated in the accompanying Drawings and described in the foregoing Detailed Description, it will be understood that these examples as disclosed are not limiting, but are capable of numerous rearrangements, modifications and substitutions without departing from the spirit set forth and defined by the following claims.

The invention claimed is:

1. A drive cage comprising:
   a base side and a top side that define altitude of the drive cage;
   a front end and a back end that define longitude of the drive cage;
   a lateral side disposed between the front end and the back end and between the base side and the top side;
   drive bays wherein each drive bay extends longitudinally;
   a first wire bundle clip fixed to the top side that extends longitudinally to a free end; and
   a second wire bundle clip fixed to the lateral side that extends altitudinally to a free end.

2. The drive cage of claim 1 further comprising a wire bundle clipped to the drive cage via the first wire bundle clip and the second wire bundle clip.

3. The drive cage of claim 2 wherein the wire bundle comprises a taped wire bundle.

4. The drive cage of claim 2 wherein the wire bundle comprises a bundle width defined in part by a wire diameter of a wire in the wire bundle.

5. The drive cage of claim 2 wherein the wire bundle comprises a bundle height defined in part by a wire diameter of a wire in the wire bundle.

6. The drive cage of claim 2 wherein the wire bundle comprises at least twenty-four wires.

7. The drive cage of claim 2 wherein the wire bundle comprises a longitudinal to altitudinal bend.

8. The drive cage of claim 7 wherein a longitudinal portion of the bend contacts the lateral side.

9. The drive cage of claim 7 wherein a space exists between an altitudinal portion of the bend and the lateral side.

10. The drive cage of claim 2 wherein the wire bundle comprises wires for a motherboard.

11. The drive cage of claim 2 wherein the wire bundle comprises wires extending from a power supply.

12. A system comprising:
one or more processors;
memory;
a power supply;
a drive cage that comprises
  a base side and a top side that define altitude of the drive cage,
  a front end and a back end that define longitude of the drive cage,
  a lateral side disposed between the front end and the back end and between the base side and the top side, and
  drive bays wherein each drive bay extends longitudinally;
at least one drive disposed in one of the drive bays of the drive cage; and
a wire bundle that extends from the power supply towards the drive cage and that comprises a longitudinal to altitudinal bend along the lateral side of the drive cage for passage of the wire bundle to the top side of the drive cage.

13. The system of claim 12 wherein the drive cage comprises another lateral side and wherein the lateral sides define latitude of the drive cage.

14. The system of claim 13 wherein the wire bundle comprises an altitudinal to latitudinal bend for passage of the wire bundle over the top side of the drive cage.

15. The system of claim 12 further comprising a motherboard and wherein the wire bundle comprises at least some wires for connection to the motherboard.

16. The system of claim 12 further comprising a chassis that comprises a width in a range of approximately 420 mm to approximately 450 mm.

17. The system of claim 12 wherein the power supply comprises a fan and wherein a gap extends longitudinally between the fan and the drive cage.

18. The system of claim 12 wherein the wire bundle comprises wire in a range of 24 gauge to 14 gauge.

* * * * *